United States Patent
Piazza

(10) Patent No.: US 12,281,012 B2
(45) Date of Patent: Apr. 22, 2025

(54) SP³-BONDED CARBON MATERIALS, METHODS OF MANUFACTURING AND USES THEREOF

(71) Applicant: Pontificia Universidad Católica Madre y Maestra, Santiago (DO)

(72) Inventor: Fabrice Piazza, Santiago (DO)

(73) Assignee: Pontificia Universidad Católica Madre y Maestra, Santiago (DO)

( * ) Notice: Subject to any disclaimer, the term of this patent is extended or adjusted under 35 U.S.C. 154(b) by 1106 days.

(21) Appl. No.: 15/734,126

(22) PCT Filed: May 31, 2019

(86) PCT No.: PCT/EP2019/064233
§ 371 (c)(1),
(2) Date: Dec. 1, 2020

(87) PCT Pub. No.: WO2019/233901
PCT Pub. Date: Dec. 12, 2019

(65) Prior Publication Data
US 2021/0206640 A1    Jul. 8, 2021

(30) Foreign Application Priority Data

Jun. 5, 2018 (GB) .................. 1809206

(51) Int. Cl.
| C01B 32/26 | (2017.01) |
| C01B 32/05 | (2017.01) |
| C01B 32/194 | (2017.01) |
| C23C 16/26 | (2006.01) |

(52) U.S. Cl.
CPC ............ C01B 32/05 (2017.08); C01B 32/194 (2017.08); C01B 32/26 (2017.08); C23C 16/26 (2013.01); C01B 2204/04 (2013.01); C01P 2002/20 (2013.01); C01P 2002/82 (2013.01)

(58) Field of Classification Search
None
See application file for complete search history.

(56) References Cited

U.S. PATENT DOCUMENTS

| 5,891,241 A | 4/1999 | Yoshida |
| 2005/0035380 A1 | 2/2005 | Dercyke et al. |
| 2014/0004032 A1 | 1/2014 | Baik et al. |
| 2016/0340777 A1 | 11/2016 | Tzeng et al. |
| 2017/0323756 A1* | 11/2017 | Koeck ................ H01J 9/14 |
| 2019/0055129 A1 | 2/2019 | Dimitrakopoulos et al. |

FOREIGN PATENT DOCUMENTS

| CN | 105239026 | * | 1/2016 |
| EP | 2244538 | | 10/2010 |
| EP | 2244538 A2 | | 10/2010 |
| TW | 201641752 A | | 12/2016 |
| WO | WO2011135100 | * | 11/2011 |
| WO | WO 2014/076576 A2 | | 5/2014 |
| WO | WO 2014076576 | | 5/2014 |
| WO | 2016096551 | * | 6/2016 |
| WO | WO-2016096551 A1 | * | 6/2016 ........... C23C 16/274 |

OTHER PUBLICATIONS

Domingues, et al. "Enhancing the oxidation resistance of diamond powder by the application of Al2O3 conormal coat by atomic layer deposition". Diamond & Related Materials. 69. 108-113 (2016).*
GIA. "Diamond Description". https://www.gia.edu/diamond-description. 2024 (Year: 2024).*
University of Maryland. "The Three Forms of Carbon". https://mse.engin.umich.edu/internal/demos/the-three-forms-of-carbon (2022). (Year: 2022).*
Cellini, Filippo et al. "Epitaxial two-layer graphene under pressure. . . ". FlatChem. 10. 8-13 (2018). (Year: 2018).*
Regemorter et al. "Effect of Substitutional N on Important Chemical vapor Deposition Diamond Growth Steps". J. Phys. Chem. A. 113. 3274-3284 (2009). (Year: 2009).*
Collins. Polytype definition. 2024 (Year: 2024).*
Bonaccorso et al (2012) Materials today, 15 (12), 564-589.
Burgess et al (2011) Carbon 49 4420-4426.
Butler et al (2008) Chemical Vapor Deposition 14 145-160.
Chernozatonskii et al (2009) JETP Letters vol. 90, #2 pp. 134-138.
Chernozatonskii et al (2012) Physica Status Solidi B 249(8), 1550-1554.
EP Exam Report dated May 12, 2023 issued on Application No. 19729472.1.
Ferrani et al (2001) Physical Review B 64, 075414-1-075414-13.
Ferrani et al (2015) Nanoscale, 7, 4598-4810.

(Continued)

*Primary Examiner* — Sheng H Davis
(74) *Attorney, Agent, or Firm* — Rudy J. Ng; Bozicevic, Field & Francis LLP

(57) ABSTRACT

The present invention provides an ultrathin and crystalline sp3-bonded carbon sheet, a stack structure, heterostructure and composite material comprising said ultrathin and crystalline sp3-bonded carbon sheet, and a method of manufacture of ultrathin and crystalline sp3-bonded carbon sheets. The method comprises the steps of providing a few-layer graphene starting material, disposing the few-layer graphene starting material on a substrate within a chemical vapour deposition chamber comprising a vacuum chamber and a feed gas inlet, and flowing a feed gas comprising hydrogen over the substrate at a substrate temperature of 325° C. or less and a pressure of 100 Torr or less to at least partially convert the few-layer graphene starting material into ultrathin and crystalline sp3-bonded carbon sheets. The method according to the present invention is the first method for successful production of ultrathin and crystalline sp3-bonded carbon sheets, including e.g. lonsdaleite sheets and diamond sheets. Advantageously it may also be relatively low cost, low waste, may avoid the use of complex apparatus having multiple components, and may allow operation under mild processing conditions.

7 Claims, 5 Drawing Sheets

(56) References Cited

OTHER PUBLICATIONS

Ferrer et al., (1991) Surface Science, 251-252, 960-964.
Frenklach et al (1991) Physical Review B 43(2), 1520-1544.
GB Search Report dated Nov. 16, 2018 issued in Application No. 1809206.4.
Gogotsi et al (1998) Journal of Applied Physics 84(3), 1299-1304.
Kosynkin et al (2009), Longitudinal unzipping of carbon nanotubes to form graphene nanoribbons, Nature, vol. 458, Apr. 16, 2009, 872-876.
Kumar et al (2013) Nature Communications 4:2618.
Leenaerts et al (2009) Physical Review B 80 , 245422-1-245422-6.
Odkhuu et al (2013) Scientific Reports, 3:3276.
Piazza (2006) International Journal of Refractory Metals and Hard Materials 24, 39-48.
Rajasekaran et al (2013) Physical Review Letters 111, 085503-1-085503-5.
Redman et al (1999) Diamond and Related Matererials 8, 1383-1387.
Regan et al (2010) A direct transfer of layer-area graphene, Applied Physics Letters 96, 113102-1-113102-3.
Robertson (2002) Materials Science and Engineering Reports 37, 129-281.
Smith et al (2009) Spectrochimica Acta Part A: Molecular and Biomolecular Spectroscopy 73, 428-435.
Stiegler et al (1997) Applied Physics Letters 70(2), 173-175.
Taiwanese Search Report dated Feb. 6, 2023.
Touhara et al (1987) rift fur anorganische und allgemeine chemie 544 7-20.
Zhu et al (2011) Nanotechnology 22 , 185202 (7pp).
Zimmer et al (2006) Diamond and Related Materials 15 229-233.
Elias et al., (2009) "Control of Graphene's Properties by Reversible Hydrogenation: Evidence for Graphane", Science 323( 5914): 610-613.
Luo et al., 2009 "Thickness-Dependent Reversible Hydrogenation of Graphene Layers", ACS Nano 3(7):1781-1788.
Bianco et al., "A Carbon Science Perspective in 2018: Current Achievements and Future Challenges", Carbon 132 (2018) 785-801.
Chandrakumar et al., "Nanoscale Curvature-Induced Hydrogen Adsorption in Alkali Metal Doped Carbon Nanomaterials" J. Phys. Chem. C (2008) 112, 15670-15679.
Criado et al., "The Covalent Functionalization of Graphene on Substrates" Angew. Chem. Int. Ed. (2015) 54, 10734-10750.
Park et al., "Generalied Chemical Reactivity of Curved Surfaces: Carbon Nanotubes", Nano Letters (2003) vol. 3, No. 9, 1273-1277.
Piazza et al., "Carbon Nanotubes Coated with Diamond Nanocrystals and Silicon Carbide by Hot-Filament Chemical Vapor Deposition Below 200 Celsius Substrate Temperature" Carbon 75 (2014) 113-123.
Perez-Luna et al., "Imaging Carbon Nanostructures' reactivity: a complimentary strategy to define chemical structure" Royal Society Publishing (2018) 1-11.
Silva et al, "Correlating Geometry of Multidimensional Carob Allotropes Molecules and Stability" Organic Electronics 26 (2015) 395-399.

* cited by examiner

SP³-BONDED CARBON MATERIALS, METHODS OF MANUFACTURING AND USES THEREOF

FIELD OF THE INVENTION

The present invention relates to sp³-bonded carbon-based materials, methods of manufacturing and uses thereof, and particularly, although not exclusively, to ultrathin (few-layer) crystalline sp³-bonded carbon materials, methods of manufacturing and uses thereof.

BACKGROUND

Theoretical work shows that materials such as few-layer diamond, and a carbon material consisting of few atomic layers (FL) of lonsdaleite, alternatively proposed to be named "diamane" by Chernozatonskii et al. (2009), have great technological promise. In diamane, sp³-bonded carbon atoms are arranged in a hexagonal lattice. Few-atomic-layer lonsdaleite can be considered to be a sp³-hybridization counterpart of few-layer-graphene. Herein, it will be referred to bilayer (2LD), trilayer (3LD) and few-layer diamane (FLD), in analogy with bilayer (2LG), trilayer (3LG) and few-layer graphene (FLG), respectively. 1LG stands for graphene whereas 1LD refers to fully hydrogenated graphene, i.e., a material known as graphane, which was first reported by Elias et al. (2009), although, those of skill in the art will recognize that, in that paper, complete hydrogenation was not achieved, as evidenced in Raman spectra published therein. There have been proposals (e.g. H. Touhara et al (1987)) that it may be possible to chemically induce a graphene to diamane transition through the chemisoption of halogens, but has not yet been achieved: those of skill in the art will recognize that diamane structure was not evidenced in this paper.

According to computational analysis, ultrathin and crystalline sp³-bonded carbon sheets could be produced by the chemisorption of hydrogen atoms (or of fluorine atoms) on the "top" and "bottom" surfaces of 2LG or 3LG and the subsequent interlayer sp³-C bond formation [Chernozatonskii et al. (2009); Leenaerts at al. (2009); Zhu et al (2011)]. Another possibility would be the conversion of FLG on a metal surface into sp³-carbon films through surface hydrogenation (or fluorination). In this case, strong hybridization between the sp³ dangling bonds orbitals and the metallic surface orbitals would stabilize the sp³-bonded carbon layers [Odkhuu et al. (2013); Rajasekaran et al. (2013)]. However, those of skill in the art will recognise that even given this teaching, these materials have not yet been produced, as evidenced by examination of experimental evidence (discussed below). Additionally, whilst a number of processes have been proposed for the hydrogenation of graphene materials, those of skill in the art will recognize that these processes did not yield ultrathin (few-layer) and crystalline sp³-bonded carbon sheets.

In Elias et al. (2009), partially hydrogenated 1LG and 2LG were obtained from the hydrogenation of free-standing membranes or from supported materials on $SiO_2$/Si wafers in a low pressure hydrogen plasma.

Those of skill in the art will recognize that, in that work, there was no evidence of any FLD formation upon hydrogen exposure. In particular, no features from diamanes were present in published Raman spectra. No electron diffraction pattern was provided.

Luo et al. (2009) studied the hydrogenation of 1LG to 4LG on $SiO_2$/Si substrates in radiofrequency (RF) hydrogen plasma. Those of skill in the art will recognize that, in that work, there is no evidence of any FLD formation upon hydrogenation of FLG in hydrogen plasma. No features from diamane were present in published Raman spectra. No electron diffraction pattern was provided.

Rajasekaran et al. (2013) reported on carbon-carbon interlayer bond formation in FLG up to 4 layers through deuterium adsorption of the surface of FLG using an atomic cracking source, which resulted in a thin film of diamond-like carbon layer on a Pt(111) substrate. The structural transformation was studied using synchrotron spectroscopic techniques (X-ray photoelectron, absorption, and emission spectroscopy). However, those of skill in the art will recognize that, in that work, crystal structure was not evidenced. No Raman spectroscopy nor electron diffraction results were reported. Those of skill in the art will recognize that the material obtained in Rajasekaran et al. work was likely sp³-C-rich amorphous carbon, that is to say tetrahedral amorphous carbon, a material also called diamond-like carbon [J. Robertson (2002); F. Piazza (2006)].

Several methods including e.g. hot-filament chemical vapour deposition, have been used to produce microcrystalline diamond (MCD) and/or nanocrystalline diamond (NCD) films. However, the films elaborated using such method are relatively thick, e.g. the thickness of MCD is of several micrometres while the thickness of NCD is of several nanometres, and it has not previously been possible to scale down these methods to produce ultrathin (few-layer) sheets.

Similarly, there are a number of known processes, [e.g. US-2015-0292107-A1; U.S. Pat. Nos. 5,243,170 A; 3,488,153 A; JP 2003117379 A; JPS 63104641 A; CA856198 A; CA928193 A; A Kumar et al. (2013)] for elaborating hexagonal diamond or lonsdaleite. However similarly, none of these processes are suitable for production of ultrathin (few-layer) crystalline sheets.

In conclusion, whilst the theoretical concept of ultrathin (few-layer) and crystalline (non-amorphous) sp³-bonded carbon sheets (including lonsdaleite sheets, including diamond sheets, or other polytypes of diamond) has been extensively discussed, such materials have not in fact been produced in practice, due to limitations in currently available methods. Accordingly, there is also no method publicly available for the production of such materials. In particular, there is no known method for production of such materials that is suitable to be scaled up and adapted to the requirements of various industries such as the electronics industry. Furthermore, many of the hypothetical routes to such materials considered in the literature suggest the use of high temperatures and/or pressures, and therefore would not be suitable for production of such materials e.g. onto temperature sensitive and/or pressure sensitive materials and devices.

The present invention has been devised in light of the above considerations.

SUMMARY OF THE INVENTION

Accordingly, in a first aspect, there is provided an ultrathin and crystalline sp³-bonded carbon sheet.

Here, ultrathin is used to generally refer to sheets having a thickness of less than 10 atomic layers. For example, the sheets may comprise between 2 and 10 atomic layers (e.g. 2, 3, 4, 5, 6, 7, 8, 9 or 10 atomic layers). The number of layers in the ultrathin and crystalline sp³-bonded carbon sheet may be the same as the number of layers in a few-layer graphene (FLG) starting material which is a precursor material for the ultrathin and crystalline sp³-bonded carbon sheet. Atomic layers here generally refers to monoatomic layers. The number of layers may be measure by any suitable technique known in the art, including but not limited to e.g. transmission electron microscopy (TEM) or atomic force microscopy (AFM).

Accordingly, the sheets may have a thickness from about 1 A, up to and including about 22 A, preferably from 2.9 Å to 22 Å. The layer thickness may vary depending on the crystallographic orientation of the crystalline sp³-bonded carbon sheet. For example, for diamond, a layer may be defined on e.g. the (111) crystallographic plane. For Lonsdaleite, a layer may be defined on e.g. the (1010), (2110), or (0001) crystallographic planes.

Crystalline here means the sp³-bonded carbon atoms are arranged in an ordered crystal structure forming a crystal lattice: i.e. not amorphous. The crystal lattice may be cubic (e.g. diamond). Alternatively, the crystal lattice may be hexagonal (e.g. lonsdaleite). In some cases, the crystal structure may be a mixture of cubic and hexagonal lattice. The crystal structure may be detected by any suitable technique. Examples of such techniques include transmission electron microscopy (TEM), electron diffraction, electron energy loss spectroscopy (EELS) and/or micro-Raman spectroscopy.

Sp³-bonded sheet is used here to define a sheet wherein the proportion of sp³ bonded carbon atoms is greater than 50%. Preferably, at least 70%, at least 80%, at least 90% or 100% of the carbon atoms in the sheet are sp³ bonded. Most preferably, substantially all carbon atoms in the sheet are sp³ bonded (in other words, most preferably the sheet does not comprise any sp² bonded carbon atoms). It is possible to measure the extent of sp³ bonding using Raman analysis.

At least a portion of the sheet (for example preferably at least 50%, at least 60%, at least 70%, at least 80% or at least 90% of the sheet) may have a structure selected from lonsdaleite (hexagonal diamond), diamond, or another diamond polytype. Preferably, the entire sheet has a structure selected from lonsdaleite, diamond, or another diamond polytype, or a combination of two or more of these structures.

The area of the sheet, or the area of the region of the sheet satisfying the requirements stated above for crystalline sp³-bonded carbon, is preferably at least 4 μm². This area is intended to be the plan view area of the sheet, measurable for example using TEM or SEM or AFM or Raman spectroscopy. More preferably this area is at least 10 μm², at least 20 μm², at least 50 μm², at least 100 μm², at least 200 μm², at least 400 μm², at least 600 μm², at least 800 μm², at least 1000 μm², or at least 2000 μm².

As discussed above, few-atomic-layer (ultrathin) sp³-bonded carbon such as lonsdaleite can be considered to be a sp³-hybridization counterpart of few-layer-graphene and is also known as diamane or few-layer diamane (FLD). In particular, production of FLD's may be particularly advantageous. This is because according to computational studies, diamanes display the electronic structure of semiconductor, with a direct band-gap depending on the film thickness. Accordingly, they may be particularly attractive for use in nanoelectronic and band-gap engineering applications. In particular, because of their direct band gap, they may be attractive for use in nanooptics, for example as an active laser medium. Additionally, they may have high thermal conductivity, which may make them particularly attractive for use in thermal management devices. FLD are also expected to be mechanically very strong, which would make them attractive for ultrathin protective coatings, ultrahigh-strength components in composite materials, and nano-electromechanical systems (NEMS). In addition, FLD are expected to be biocompatible, so that they may become useful structure components in bio-devices and bio-sensors.

The sheet may be electronically doped. For example, the sheet may comprise incorporated nitrogen-vacancy (N-V) centres by substitution of nitrogen atoms in the C lattice. Such doping could be used e.g. to configure qbits for use in quantum computing. The form of electronic doping is not particularly limited, and doping with other (e.g. non-nitrogen) elements may also be desirable for certain applications such as nanoelectronics. Electronic doping of the sheets may be achieved by mixing $H_2$ feed gas with another gas precursor, e.g. with a gas precursor comprising B or P.

The sheets (and similarly an FLG starting material used to make such sheets) may be supported or coated on a substrate. The substrate may be non-continuous (e.g. a TEM grid having holes) such that at least some of the sheets (and FLG starting material) are suspended or unsupported (e.g. the FLG starting material and consequently the ultrathin crystalline sheet may be formed as a membrane suspended across a TEM grid). The sheets (and the FLG starting material) may be free-standing. Where the sheets are supported/coated on a substrate, the substrate may comprise e.g. polymeric material, a semiconductor material, a metal material, a ceramic material, or a device structure. Advantageously, the low temperatures and pressures used in methods disclosed herein may allow processing of materials or devices that otherwise would be too temperature-sensitive and/or too pressure-sensitive for coating using conventional techniques.

The "top" and/or "bottom" surfaces (i.e. surfaces in a basal plane of the sheet) may be covalently bonded with hydrogen atoms. Alternatively or additionally, such surfaces may be covalently bonded with one or more atoms from: the first column of the periodic table (e.g. lithium, sodium, potassium or caesium); the second column of the periodic table (e.g. beryllium, magnesium or calcium); transition metals (e.g. titanium, chromium, iron, cobalt, nickel, copper, zinc, molybdenum, palladium, silver, tungsten, platinum or gold); the thirteenth column of the periodic table (e.g. boron, aluminum, gallium, or indium); fourteenth column of the periodic table (e.g. silicon, germanium, tin, or lead); the fifteenth column of the periodic table (e.g. nitrogen phosphorus, arsenic, antimony, or bismuth); the sixteenth column of the periodic table (e.g. oxygen or sulfur); the seventeenth column of the periodic table (e.g. fluorine, chlorine, bromine or iodine). Alternatively or additionally, the "top" and/or "bottom" surfaces may be covalently bonded with one or more hydroxyl groups.

Sheets as set out above may be prepared by a method as set out below in relation to the fifth aspect of the invention.

In a second aspect, there is provided a stack structure comprising one or more ultrathin and crystalline sp³-bonded carbon sheets according to the first aspect. The stack structure may comprise a plurality of ultrathin and crystalline sp³-bonded carbon sheets according to the first aspect.

In a third aspect, there is provided a heterostructure comprising one or more ultrathin and crystalline sp³-bonded carbon sheets according to the first aspect. The heterostructure may comprise a plurality of ultrathin and crystalline sp³-bonded carbon sheets according to the first aspect.

The stack structure or heterostructure may further comprise a material selected from: a one-dimensional material, a two-dimensional material, nanotubes, or nanowires.

Where the stack structure or heterostructure comprises nanotubes and/or nanowires, these may be carbon nanotubes or nanowires.

Suitable two-dimensional materials may include e.g. graphene. Stack structures and/or heterostructures which combine graphene and sheets according to the first aspect may be attractive for use in e.g. tunnel devices, optical linear waveguides, high efficiency optoelectronic sensors, lithium batteries, and supercapacitors.

In a fourth aspect, there is provided a composite material comprising a matrix material and one or more ultrathin and crystalline $sp^3$-bonded carbon sheets according to the first aspect. Such composite materials may offer advantages including but not limited to: improved physical and chemical properties e.g. improved thermo-oxidative stability, improved thermal properties e.g. higher thermal conductivity, improved mechanical properties e.g. increased hardness, increased toughness, increased stiffness.

The matrix material may comprise a polymer, a semiconductor, a ceramic, a metal, or combinations thereof. The ultrathin and crystalline $sp^3$-bonded carbon sheet(s) may be dispersed throughout the matrix material.

In a fifth aspect, there is provided a method of manufacture of ultrathin and crystalline $sp^3$-bonded carbon sheets comprising the steps of:
  providing a few-layer graphene starting material
  disposing the few-layer graphene starting material on a substrate within a chemical vapour deposition chamber comprising a vacuum chamber and a feed gas inlet; and
  flowing a feed gas comprising hydrogen over the substrate at a substrate temperature of 325° C. or less and a pressure of 100 Torr or less to at least partially convert the few-layer graphene starting material into ultrathin and crystalline $sp^3$-bonded carbon sheets.

The method disclosed herein is the first method for successful production of ultrathin and crystalline $sp^3$-bonded carbon sheets, including e.g. lonsdaleite sheets and diamond sheets. It is relatively low cost, and avoids the use of complex apparatus having multiple components. It also produces relatively little waste.

Additionally, due to the relatively mild conditions of the process (low temperature, low pressure), it is possible to directly elaborate ultrathin and crystalline $sp^3$-bonded carbon sheets on e.g. temperature sensitive, or otherwise fragile materials and devices, which may not be suitable materials for use in higher temperature or pressure processes.

Furthermore, use of such mild process conditions helps to preserve the integrity of the crystal lattice in comparison to e.g. plasma-based processes which result in production of ions which can cause unwanted damage to the crystal lattice.

In an alternative aspect, there is provided a method of manufacture of ultrathin and crystalline $sp^3$-bonded carbon sheets comprising the steps of:
  providing a few-layer graphene starting material
  disposing the few-layer graphene starting material on a substrate within a chemical vapour deposition chamber comprising a vacuum chamber and a feed gas inlet; and
  flowing a feed gas over the substrate at a substrate temperature of 325° C. or less and a pressure of 100 Torr or less, the feed gas having a composition capable of at least partially converting the few-layer graphene starting material into ultrathin and crystalline $sp^3$-bonded carbon sheets.

The few-layer graphene (FLG) starting material can be obtained or prepared according to any technique apparent to those of skill in the art. Useful processes include those described or referenced in F. Bonaccorso et al, Materials Today, 2012, 15, 564-589; A. C. Ferrari et al., Nanoscale, 2015, 7, 4598-4810. Generally, graphene is a two-dimensional atomic crystal made up of carbon atoms arranged in a hexagonal lattice. FLG are composed of several stacked graphene layers, typically between 2 and 6 layers. The few-layer graphene (FLG) starting material may comprise less than 10 atomic layer graphene sheets. For example, the graphene starting material may comprise 2-6 atomic layer graphene sheets. The FLG may be composed of pure carbon. Alternatively, the FLG may comprise one or more trace elements, for example elements selected from the group consisting of nitrogen, boron, oxygen and hydrogen, and combinations thereof. Preferably, the FLG comprises at least 99% carbon. The FLG used as a starting material may be grown or supported on a substrate. Alternatively, the FLG may be freestanding. Where the FLG is grown on or supported by a substrate, the substrate may be e.g. copper or other transition metal such as nickel, silicon, silicon oxide, quartz or polymers. Additionally or alternatively, the substrate may be a part of a device structure. Additionally or alternatively, the substrate may be a part of support grid. The FLG may be directly grown on such a substrate, or may be transferred to the substrate. In some cases, the FLG may be grown or transferred to the substrate in such a way as to form a pattern on the substrate. Alternatively, the FLG may be randomly dispersed on the substrate. The FLG may be arranged on the substrate as individual sheets of few-layer graphene. Alternatively, they can be arranged on the substrate as sheet bundles of FLG. Preferably, the FLG starting material is homogenous, homogeneity being considered with respect to the number of layers in each FLG sheet. In other words, preferably substantially all of the sheets of the FLG starting material have the same number of layers. This can be determined by e.g. transmission electron microscopy. Most preferably, the FLG starting material is a very homogenous pristine material. By selecting a starting material having an appropriate homogeneity, and by controlling alignment of the graphene sheets it is possible to control the diamond polytype formed according to the method described above. Alignment can be estimated by e.g. electron diffraction analysis.

Preferably, on completion of the process, the few-layer graphene is fully converted to crystalline $sp^3$-bonded carbon sheets. However, in some embodiments, one or more monoatomic graphene layers remain after conversion. Partial conversion of the FLG starting material may result in formation of a stack structure comprising FLG or 1LG and $sp^3$-bonded carbon sheets according to the first aspect. Such stack structures may comprise e.g. 1, 2, 3 or 4 graphene sheets and e.g. 2, 3, 4 or 5 crystalline $sp^3$-bonded carbon sheets. The precise arrangement and number of sheets is not particularly limited. Additionally, the arrangement and number of sheets can be quantified by any suitable method, for instance, transmission electron microscopy (TEM) and related analytical techniques such as electron diffraction and electron energy loss spectroscopy.

At least a portion of the FLG starting material may be covered by a mask. In this way the portion of few-layer graphene left uncovered could be converted to ultrathin crystalline $sp^3$-bonded carbon sheet, while those portions covered by the mask may not be converted. Accordingly, it is possible to produce a patterned sheet.

The chemical vapor deposition chamber may comprise a filament. Such filament may be heated as the hydrogen is flowed over the substrate to promote thermal decomposition and/or activation of the feed gas. For example, hydrogen dissociation from a hydrogen-containing feed gas. In other words, the CVD chamber may be configured as a hot-filament CVD (HFCVD) chamber. The filament may comprise a material selected from the group consisting of tungsten, rhenium, tantalum and platinum and combinations thereof. Preferably the filament is a tungsten wire or a rhenium wire. The number of filaments is not particularly limited. Indeed, it may be preferable to have more than one filament, e.g. 2, 3 or 4 filaments. Where multiple filaments are used, the filaments may be the same, or may be different (e.g. made from different materials). Preferably, where multiple filaments are used, they are of the same material. This can lead to better homogeneity of results. Where filaments are made of different materials, they will typically have different electrical resistances, and may therefore operate at different temperatures. The filament(s) may be held by a filament support.

Where HFCVD is used, the temperature of the filament(s) may be selected appropriately given the particular filament material, and the process to be performed. The filament temperature may be greater than about 1800° C., greater than about 1900° C., greater than about 2000° C., greater than about 2100° C., greater than about 2200° C., greater than about 2300° C., greater than about 2400° C., or greater than about 2500° C. Preferably the filament temperature is selected to be high enough to achieve hydrogen dissociation. Preferably the filament temperature is selected to be low enough that it does not raise the temperature of the substrate to an undesirable level. The filament temperature can be controlled by varying filament current in a well-known manner. The filament temperature may be measured e.g. using a dual-wavelength pyrometer.

The temperature of few-layer graphene (FLG) starting material is controlled by controlling the temperature of a substrate on which the FLG is disposed, and the distance of the substrate from the filament(s). Accordingly there may be a cooling system incorporated into a substrate holding portion of the apparatus. The substrate temperature may be less than or equal to about 325° C., less than or equal to about 300° C., less than or equal to about 250° C., less than or equal to about 200° C. or less than or equal to about 170° C. Preferably, the substrate temperature is from about 170° C. to 325° C., e.g. 170 to 300° C., 170 to 275° C., 170 to 250° C., 170 to 225° C., or 170 to 200° C. Where the substrate temperature is higher than 325° C., there may be unwanted etching of the FLG starting material, or desorption of H from a hydrogenated surface of the ultrathin and crystalline $sp^3$-bonded carbon sheets. The substrate temperature may be measured e.g. using a thermocouple located on the surface of the substrate, taking into account the effect of contact thermal resistance, and the thickness of the thermocouple tip.

Accordingly, the temperature of the FLG during the conversion process may be less than or equal to about 325° C., less than or equal to about 300° C., less than or equal to about 250° C., less than or equal to about 200° C. or less than or equal to about 170° C. Preferably, the FLG temperature is from about 170° C. to 325° C., e.g. 170 to 300° C., 170 to 275° C., 170 to 250° C., 170 to 225° C., or 170 to 200° C.

Preferably the process is performed under low to medium vacuum. Accordingly, the step of flowing a feed gas may be performed at less than about 100 Torr, less than about 75 Torr, or at a pressure of less than about 50 Torr. Preferably the minimum pressure is about 5 Torr. Accordingly, the pressure may be from about 5 to about 100 Torr, from about 5 to about 75 Torr, or from about 5 to about 50 Torr. Providing a pressure of less than about 100 Torr can help to prevent undesirable recombination of H. Providing a pressure of greater than about 5 Torr can help to prevent undesirable increases in filament and substrate temperature.

The feed gas may be a single feed gas. Alternatively, multiple feed gases, or a feed gas mixture may be used. Any suitable hydrogen-containing gases e.g. $H_2$, $H_2S$, $NH_4$, $B_3N_3H_6$, $B_2H_6$ may be used, alone or in combination. Preferably, the feed gas comprises diatomic hydrogen ($H_2$). Most preferably, hydrogen ($H_2$) gas is the sole feed gas. Where multiple feed gases or a feed gas mixture is used, the feed gas may further comprise non-hydrogen-based gases e.g. $N_2$, $F_2$, $Br_2$, Ar, or He.

The flow rate of the feed gas is not particularly limited and may be selected as appropriate given the specific feed gas and process being performed. However, the flow rate may be less than about 250 standard cubic centimeters per minute (sccm), less than about 200 sccm, less than about 150 sccm, less than about 100 sccm, less than about 75 sccm, less than about 50 sccm or less than about 25 sccm. The flow rate may be between 1 and 250 sccm, between 1 and 200 sccm, between 1 and 150 sccm, between 1 and 100 sccm, between 1 and 75 sccm, between 1 and 50 sccm or between 1 and 25 sccm.

An additional solid source may be provided to incorporate one or more selected elements into the ultrathin and crystalline $sp^3$-bonded carbon sheets. The solid source may be placed near the FLG substrate. In this way, the solid source may undergo hydrogen etching during operation of the CVD apparatus, the etched material from the solid source thus being incorporated into the graphene and/or $sp^3$-C layer(s).

The step of flowing the feed gas over the substrate should be performed for a sufficient length of time to achieve hydrogenation of the few-layer graphene and the subsequent transformation of few-layer graphene into few-layer crystalline $sp^3$-bonded carbon. Accordingly, the flow may be maintained for at least about 1, 2, 3, 4, 5, 6, 7, 8, 9, 10, 15, 20, 25, or more minutes. In some cases, the flow is maintained for at least about 1, 2, 3, 4, 5, 6, 7, 8, or more hours. A longer time may result in more complete conversion of the FLG to few-layer crystalline $sp^3$-bonded carbon. However, it may also result in greatest cost and material wastage. Accordingly, the time should be selected as appropriate balancing these two factors.

In a sixth aspect there is provided an ultrathin and crystalline $sp^3$-bonded carbon sheet produced according to the method of the fifth aspect.

In a seventh aspect there is provided a stack structure comprising one or more ultrathin and crystalline $sp^3$-bonded carbon sheets produced according to the method of the fifth aspect.

In an eighth aspect there is provided a heterostructure comprising one or more ultrathin and crystalline $sp^3$-bonded carbon sheets produced according to the method of the fifth aspect.

In a ninth aspect there is provided a composite material comprising a matrix material and one or more ultrathin and crystalline $sp^3$-bonded carbon sheets produced according to the method of the fifth aspect.

Materials and methods as set out above may find use in a wide variety of consumer and industrial products, including but not limited to: technology utilizing semiconductors, electronic devices (e.g., computers, mobile phones, and the like), telecommunication devices, and medical devices.

Accordingly provided herein are various products comprising an ultrathin and crystalline $sp^3$-bonded carbon sheet as described above in relation to various aspects of the invention, including but not limited to: nanoelectronics, transistors, integrated circuits, field emission and other electronic devices, electrical field shields, thermal management devices, quantum computers, quantum computing devices, photonic devices, spintronic devices, protective coatings (including wear-resistant coatings), functional composite materials, micro- and nano-electromechanical systems (NEMS), bio-devices and bio-sensors, medical devices, chemical sensors, tunnel devices, optical (linear) waveguides, optoelectronic sensors, an active laser medium (gain/lasing medium), lithium batteries and supercapacitors.

Additionally provided herein are various products coated with an ultrathin and crystalline $sp^3$-bonded carbon sheet as described above in relation to various aspects of the invention, including but not limited to: polymeric materials and semiconductor materials.

The invention includes the combination of the aspects and preferred features described except where such a combination is clearly impermissible or expressly avoided.

SUMMARY OF THE FIGURES

Embodiments and experiments illustrating the principles of the invention will now be discussed with reference to the accompanying figures in which:

FIG. 4 shows a UV Raman spectrum of lonsdaleite sheets elaborated from the conversion of few-layer graphene according to the present invention (excitation wavelength of 244 nm). The lonsdaleite peak is centred at around 1323.1 $cm^{-1}$.

FIG. 5 shows a UV Raman spectrum of graphene-lonsdaleite sheets stack structure elaborated from the conversion of few-layer graphene at low few-layer graphene temperature according to the present invention (excitation wavelength of 244 nm). The lonsdaleite peak is centred at around 1323.3 $cm^{-1}$.

FIG. 6 shows a UV Raman spectrum of a graphene-lonsdaleite sheet stack structure elaborated from the conversion of few-layer graphene according to the present invention (excitation wavelength of 244 nm). The lonsdaleite peak is centred at around 1323.4 $cm^{-1}$.

FIG. 7 shows a UV Raman spectrum of ultrathin diamond sheets elaborated from the conversion of few-layer graphene according to the present invention (excitation wavelength of 244 nm). The diamond peak is centred at around 1333.1 $cm^{-1}$.

FIG. 8 shows a UV Raman spectrum of a graphene-diamond sheet stack structure elaborated from the conversion of few-layer graphene according to the present invention (excitation wavelength of 244 nm). The diamond peak is centred at around 1330.1 $cm^{-1}$.

DETAILED DESCRIPTION OF THE INVENTION

The compositions and methods provided herein are based, in part, on previous investigations of the use of hot-filament chemical vapour deposition (HFCVD) for the growth of nanocrystalline diamond thin films and the conformal coating of carbon nanotube bundles by diamond and silicon carbide nanocrystals at low substrate temperature by the present inventors, as described in U.S. Pat. No. 9,458,017, Piazza, 2015. The preferred embodiments of the present invention demonstrate a simple and efficient route to production of detectable ultrathin and crystalline $sp^3$ bonded carbon sheets. In the more preferred embodiments, the sheets have a lonsdaleite or diamond crystal structure, or a combination of these two structures.

Preferred methods of the present invention use an HFCVD for production of such materials. Use of HFCVD may be particularly advantageous due to its simplicity and ease of implementation—previously, it has been used in a number of processes for the production of microcrystalline and nanocrystalline diamond films [M. A. Prelas et al. (1998); J. E. Butler et al. (2008); J. Zimmer. Et al. (2006)], because of the efficiency of production of atomic hydrogen, which has been shown to play an important role for the conventional synthesis of metastable diamond at low pressure from a dilute mixture of a hydrocarbon in $H_2$. [M. A. Prelas at al. (1998); M. Frenklach et al. (1991); J. Stiegler, et al. (1997); S. A. Redman et al. (1999)]. When an HFCVD process is used, atomic hydrogen, H, is produced heterogeneously by the thermal decomposition of $H_2$ on the hot filament surface, which then rapidly diffuses into the bulk gas. H recombination reactions are sufficiently slow at the process pressures used in the present invention that much of the atomic H diffuses to the reactor walls. Atomic H is present at super-equilibrium concentrations throughout most of the reactor. HFCVD process advantageously reduces the presence on ions accelerated towards the substrate, in comparison to e.g. low pressure plasma techniques. Accordingly, damage to the graphene starting material and/or the crystalline $sp^3$-bonded carbon sheets can be reduced or avoided, because production of high kinetic energy ions (which tend to etch the sheets instead of participating in a hydrogenation process) is inhibited.

Figure 1:
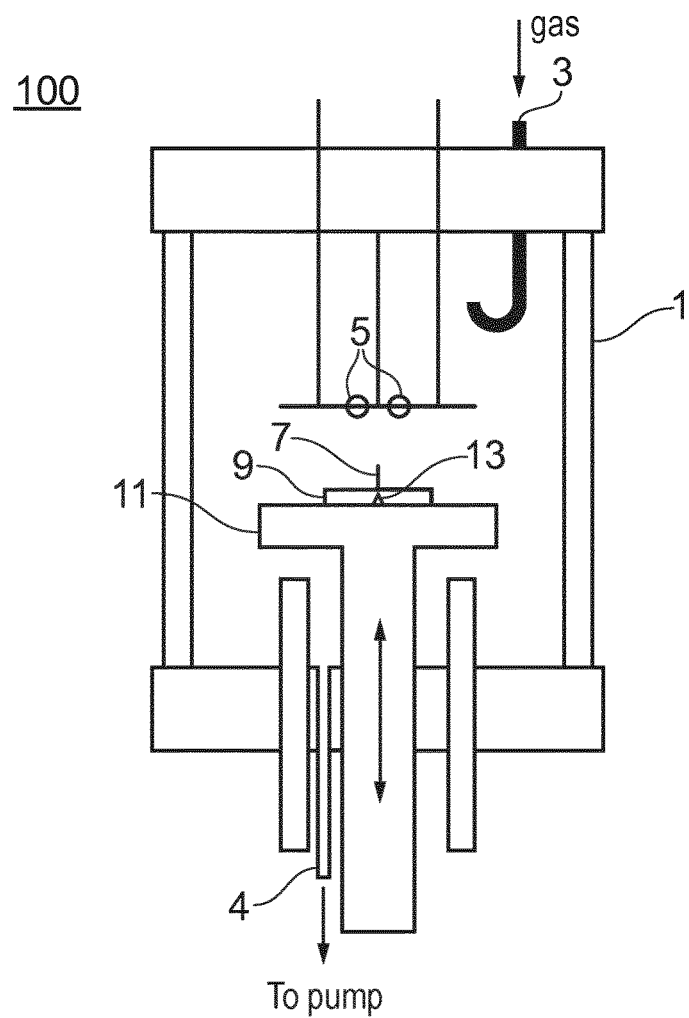
FIG. 1 shows a schematic of a hot-filament chemical vapour deposition (HFCVD) system as used in one method according to the present invention.

FIG. 1 shows a schematic of a hot-filament chemical vapour deposition (HFCVD) system as used in one method according to the present invention. The apparatus 100 comprises a vacuum chamber 1 having an inlet 3 for feed gas (represented by arrow), an outlet 4 to a vacuum pump, two filaments 5 (typically tungsten or rhenium wires) positioned approximately 1 cm apart, and on either side of the substrate 7 (here a vertically-positioned TEM grid having FLG disposed thereon) held by substrate support 9. Whilst the grid is vertically arranged in this schematic, the few-layer graphene grids can alternatively be placed horizontally on the substrate support, or at an angle to the substrate support—in other words, the grid may be disposed at an angle between 0 and 90° to the substrate support.

The substrate support is disposed on substrate holder 11, which comprises a fluid cooling system (not visible), a thermocouple 13 disposed immediately adjacent the substrate 7 for detecting the temperature of the substrate to allow for monitoring and control of the temperature of the substrate (e.g. by operation of the cooling system within the substrate holder) during operation of the HFCVD system. The substrate holder 11 is vertically moveable in the vacuum chamber 1. This allows for the substrate to be moved closer to, or further from, the filaments 5 as appropriate for the process being performed.

The temperature of the substrate 7 is controlled to be 325° C. or less, such that the temperature of the FLG on the substrate is about 325° C. or less.

A feed gas (here, $H_2$) is flowed into the vacuum chamber at a flow rate of between 1 and 250 sccm. At the same time, the vacuum pump is operated, to maintain pressure in the vacuum chamber at a pressure of 100 Torr or less. The gas flow may be regulated by e.g. a mass flow controller, in a manner well known to the skilled person. The pressure may be regulated by e.g. an automatic valve located below the substrate holder.

The step of flowing the feed gas over the substrate is performed for a time sufficient to at least partially convert the few-layer graphene disposed on the substrate into ultrathin and crystalline $sp^3$-bonded carbon sheets. The FLG is converted by hydrogenation of the few-layer graphene, followed by subsequent transformation of few-layer graphene into few-layer crystalline $sp^3$-bonded carbon. Such hydrogenation of few-layer graphene can be detected by Fourier Transform Infrared (FTIR) spectroscopy and microscopy.

The precise configuration (number of layers, crystal structure etc.) of the ultrathin crystalline $sp^3$-bonded carbon sheets can be detected and/or analyzed by a number of methods. For example, such sheets may be analyzed using one or more techniques selected from: visible or ultraviolet (UV) Raman spectroscopy; transmission electron microscopy (TEM); electron diffraction (ED); or electron energy loss spectroscopy (EELS).

In particular, for determining the crystallinity of the produced material, Raman spectroscopy is a particularly useful technique, due to its simplicity. A crystalline structure will generally display clear, sharp and distinct peaks corresponding to the various vibrational modes of the material. Comparatively, a Raman spectrum of an amorphous carbon sheet (e.g. ta-C, or diamond-like carbon), will generally display 2 broad and overlapping bands (the D and G bands). An example of a typical Raman spectrum from ta-C (tetrahedral $sp^3$ amorphous carbon) can be seen in FIG. 48 of J. Robertson, "Diamond-like amorphous carbon", Materials Science and Engineering. R 37, 129-281 (2002). For comparison with Raman spectra discussed below in relation to materials produced according to the present invention, the relevant spectra is that taken at an excitation wavelength of 244 nm.

EXAMPLES

Example 1

As received commercial chemical vapour deposition (CVD) graphene film deposited on 3 mm ultrafine copper transmission electron microscopy (TEM) grids (2000 Mesh) were used as graphene materials (from Graphene Supermarket, SKU #SKU-TEM-CU-2000-025). Graphene was grown by CVD from $CH_4$ at 1000° C. on Ni substrate and transferred to a commercial TEM grid using polymer-free transfer methods to minimize contamination as described in W. Regan et al. (2010). The thickness of CVD graphene film was between 0.3-2 nm (1-6 monolayers). Typical graphene coverage of the TEM grid is between 60 and 90%.

A commercial HFCVD system from Blue Wave Semiconductors (BWI 1000 model) was used for hydrogenation and subsequent structure conversion of few-layer graphene into ultrathin and crystalline $sp^3$-bonded carbon sheets. A schematic of this system is shown in FIG. 1, and described above.

The reactor is a six-way cross stainless steel vacuum chamber. It is fluid cooled (15% water, 75% glycol at 18° C.) with brazed copper tubing covered with an aluminium foil. The reactor is equipped with a molybdenum filament cartridge that accommodates between one and three 0.5 mm diameter straight metallic wires. Typically tungsten or rhenium wires are used. In this example, tungsten wires were used. Typically two 5.7 cm length wires, 1 cm apart, are used. Substrates were placed on the movable and fluid-cooled 5 cm diameter sample stage. The few-layer graphene grids were placed vertically on the substrate holder and were pinched by two (100) silicon pieces (500-550 μm thickness, 14 mm×14 mm) to keep their position fixed during operation.

The substrate temperature and the temperature of the few-layer graphene were estimated by a thermocouple tip located on top of the surface of the substrate holder located in front of the filaments. Before synthesis, the HFCVD system was evacuated to below $4\times10^{-4}$ mbar using a turbomolecular pump backed with a hydrocarbon oil pump.

For hydrogenation, ultra-high purity (UHP) $H_2$ gas (about 99.999% pure) was the only gas introduced into the chamber via a stainless steel tube located on top of the chamber. Gas flow was regulated by an Omega mass flow controller. The pressure, P, was regulated via an automatic valve located below the substrate holder. The filament temperature, TF, was monitored with a two colour pyrometer (M90R2 model from Mikron Infrared, Inc.). The pressure and flow were 50 Torr and 1 sccm, respectively. Before synthesis, the tungsten filament was not exposed to activated hydrocarbon gas for carburization or conditioning as it is necessary for the conventional growth of diamond by HFCVD to stabilize filament temperature. This was to avoid carbon contamination from a carburized filament. The distance between the substrate holder and the filaments, d, was 22.8 mm. The current for both filaments, was kept constant, at 55 Å, which resulted in a filament temperature of 2330° C. The resulting substrate holder temperature was about 300° C. The maximum few-layer graphene temperature was of about 325° C., due to the closer proximity of the TEM grid substrate to the filaments. The duration of the hydrogenation process was 6 minutes and 20 seconds.

Material Analysis & Methods

Multi-wavelength Raman spectroscopy (RS) was employed to examine the material structure before and after hydrogenation. Raman spectra were recorded with a Renishaw InVia Reflex Spectrometer System with a stigmatic single pass spectrograph using the 244, 488 and 514.5 nm lines of Ar ion lasers. In the visible, ×50 and ×100 objectives were used. In the UV, ×40 objective was employed. The laser power on the sample and acquisition time were adjusted to obtain optimum signal without any sample modification. No visible damage and no change of the spectral shape during measurements have been observed. Silicon and highly-oriented pyrolytic graphite (HOPG) were used for peak position calibration: silicon for spectra excited with visible radiation, and HOPG for spectra excited with deep UV radiation. Raman mapping was employed using high speed encoded mapping stage and a 1" CCD to generate high definition 2D chemical images over hundreds of microns square. C—H bonds were directly detected using Fourier Transform Infrared (FTIR) spectroscopy. FTIR images and spectra were recorded with an Agilent Technologies Cary 670 FTIR spectrometer coupled to a Cary 620 FTIR microscope equipped with a 64×64 focal plane array (FPA) mercury cadmium telluride (MCT) detector. Attenuated Total Reflection (ATR) mode, with a Germanium crystal as internal reflection element, was employed.

Figure 2:
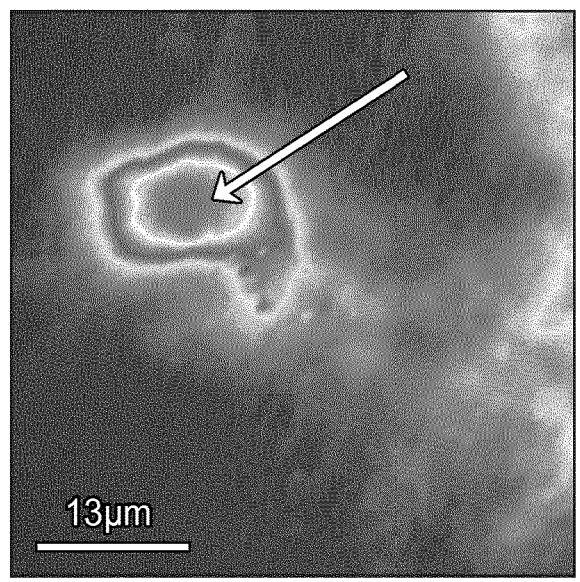
FIG. 2 shows exemplary FTIR-ATR microscopy image processed on the integrated intensity of C—H stretching band, of few-layer graphene converted into ultrathin and crystalline $sp^3$-carbon sheets according to the present invention.

FIG. 2 shows FTIR-ATR image processed on the integrated intensity of C—H stretching band. The image was obtained on the TEM grid material which is around the TEM grid mesh, and which was exposed to $H_2$ gas activated by HFCVD. Prior treatment, this region of the grid contains few-layer graphene as evidenced by Raman spectroscopy analysis. FIG. 2 reveals a large-sized area of several microns square (up to about 10 µm in diameter) containing C—H bonding, which indicates that hydrogenation took place in the basal plane of graphene, not only in the edges of graphene domains.

Figure 3:
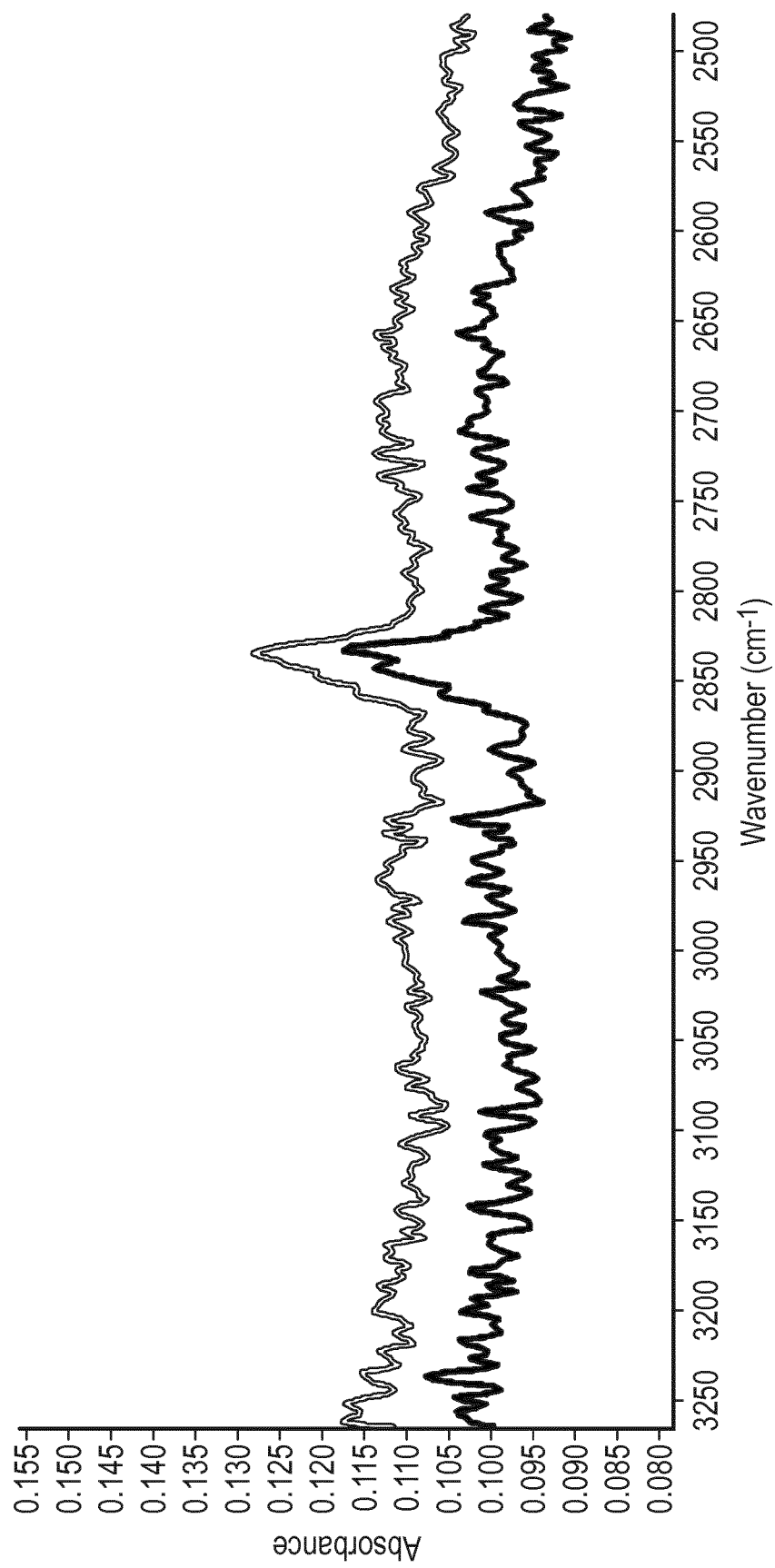
FIG. 3 shows exemplary absorbance FTIR spectra taken in the region identified by a white arrow in FIG. 2.

FIG. 3 displays two absorbance spectra (vertically offset from each other for clarity) taken in the region identified by a white arrow in FIG. 2. FIG. 3 shows that the C—H stretching band, which is centred at around 2844 $cm^{-1}$, is composed of only one of the 9 possible vibration mode components. The inventors believe that this mode corresponds to the $C(sp^3)$-H stretching mode. This hypothesis is based on the following arguments:

1. Taking into account vibration modes in free molecules, within the wavenumber range of 2800 to 2900 $cm^{-1}$, it is expected to detect the following vibration modes: $C(sp^3)$-H centred at around 2900 $cm^{-1}$, $C(sp^3)$-$H_2$ symmetrical centred at around 2875 $cm^{-1}$ and $C(sp^3)$-$H_3$ symmetrical centred at around 2850 $cm^{-1}$. However, although the infrared absorption cross-section of the C—H stretching vibration modes is unknown in hydrogenated few-layer graphene and in ultrathin and crystalline $sp^3$-bonded carbon sheets, it is expected that the $C(sp^3)$-$H_2$ symmetrical and $C(sp^3)$-$H_3$ symmetrical modes would be simultaneously detected with their antisymmetrical counterpart, which is not the case since the observed C—H stretching band is composed of only one vibration mode component. Therefore, the $(sp_3)$-$H_2$ symmetrical and $C(sp^3)$-$H_3$ symmetrical modes are excluded.
2. The $C(sp^2)$-H olefinic and $C(sp^2)$-H aromatic modes are not considered as they are typically detected at much higher wavenumber, above 2975 $cm^{-1}$, considering the case of free molecules.
3. The $C_2H_2$ olefinic symmetrical and antisymmetrical modes are also typically detected at significantly higher wavenumber, above 2950 $cm^{-1}$, considering the case of free molecules. Furthermore, they would be accompanied by their anti/symmetrical counterpart, which is not the case here, since the observed C—H stretching band is composed of only one vibration mode component.

The shift, by around 56 $cm^{-1}$, of the position of the $C(sp^3)$-H mode peak, as compared to the corresponding position in free molecules, is theorised to result from the stress generated by the hydrogenation of few-layer graphene, the subsequent conversion of $sp^2$ hybridization into $sp^3$ hybridization and interlayer $sp^3$-C bond formation.

The narrow, one component C—H stretching band reveals that carbon atoms are bonded to one hydrogen atom. This one component narrow C—H stretching band has never before been reported for hydrogenated graphene. Known disclosures on FTIR spectroscopy analysis of hydrogenated graphene report on a multi-component C—H stretching band including $C(sp^3)$-$H_3$ modes instead of $C(sp^3)$-H mode, consistent with graphene domains of reduced size which are hydrogenated only on their edges. Comparatively, the one component narrow C—H stretching band shown here is representative of large-sized hydrogenated graphene planes.

FIG. 2 and FIG. 3 together therefore confirm the hydrogenation of few-layer graphene by the direct detection of C—H bonding.

Figure 4:
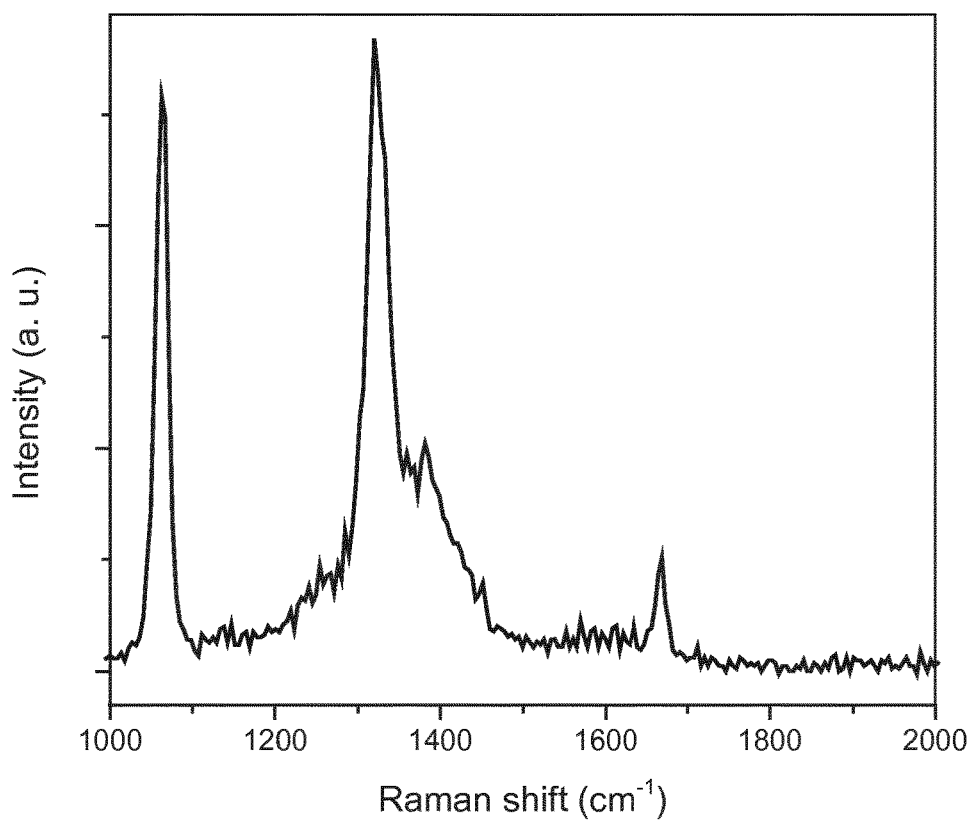
FIGS. 4-8 show UV Raman spectra of different regions of an embodiment of the invention formed by conversion of few-layer graphene.

FIG. 4 shows exemplary UV Raman spectrum of lonsdaleite sheets elaborated from the hydrogenation of few-layer graphene and subsequent interlayer $sp^3$-C bond formation, at low few-layer graphene temperature, according to the present invention. The spectrum is obtained in the vicinity of the region analysed by FTIR microscopy (FIGS. 2 and 3) and also in the TEM grid mesh where free-standing graphene is originally located.

The spectrum shown in FIG. 4 is different from the spectrum obtained before the hydrogenation process, which is composed of the G peak at around 1582 $cm^{-1}$ due to C—C $sp^2$ vibration. The spectrum shown in FIG. 4 displays two sharp peaks, centred at around 1063.0 $cm^{-1}$ and at around 1323.1 $cm^{-1}$, respectively. The full width at half maximum of those two peaks is of around 15.6 $cm^{-1}$ and 30.2 $cm^{-1}$, respectively. The peak centred at around 1063.0 $cm^{-1}$ is the T peak, due to C—C $sp^3$ vibration, found in amorphous carbon films as a low-intensity and broad band (A. C. Ferrari, J. Robertson, Resonant Raman spectroscopy of disordered, amorphous, and diamond-like carbon, Physical Review B 64, 075414(2001). Here, the T-peak is narrow and high-intensity, showing that the structure of the $sp^3$-C in the material is crystalline. The peak centred at around 1323.1 $cm^{-1}$ is the lonsdaleite peak (E vibrational mode) [D. C. Smith et al. 2009); Y. G. Gogotsi, et al. (1998); L. A. Chernozatonskii et al. (2012)].

In amorphous carbon, the FWHM of the T peak is wide because of the amorphous structure of the material. In lonsdaleite, the FWHM is much lower because of the crystal structure of the material. The FWHM value of the lonsdaleite peak reveals confinement effects in few atomic layers. The detection of C—C $sp^3$ vibration and lonsdaleite in Raman spectra is consistent with the detection of only one component in the FTIR C—H stretching band (FIGS. 2 and 3). The results show that lonsdaleite is elaborated from the free-standing few-layer graphene or from the few-layer graphene on the copper substrate.

Figure 5:
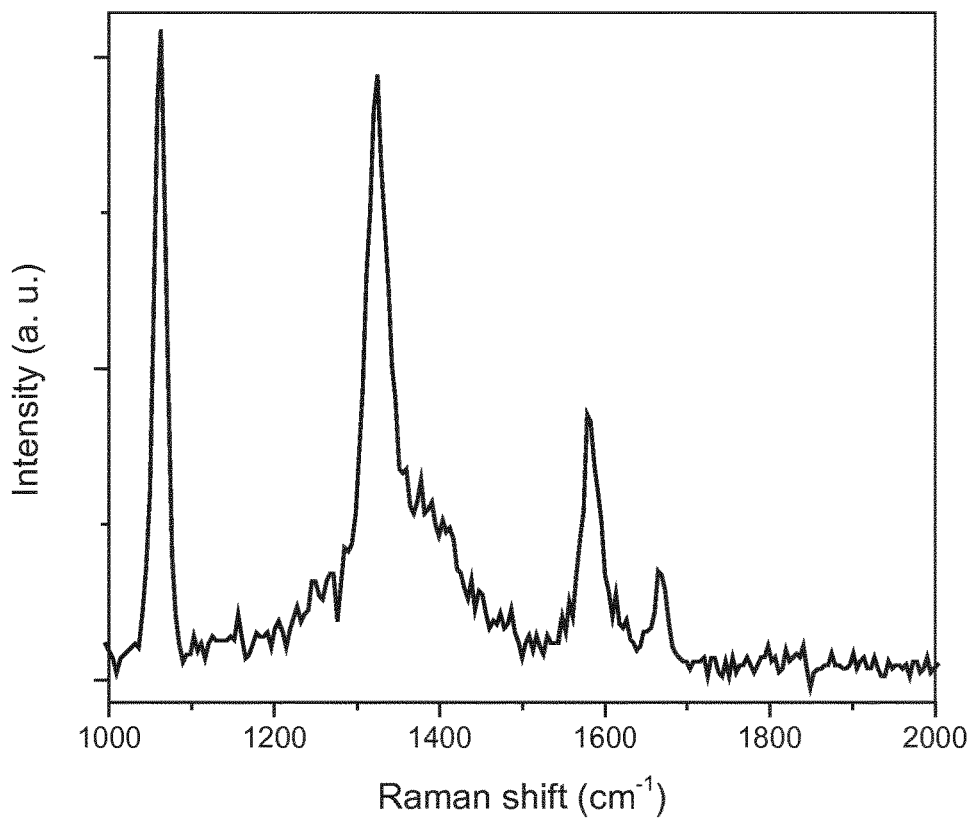
Figure 6:
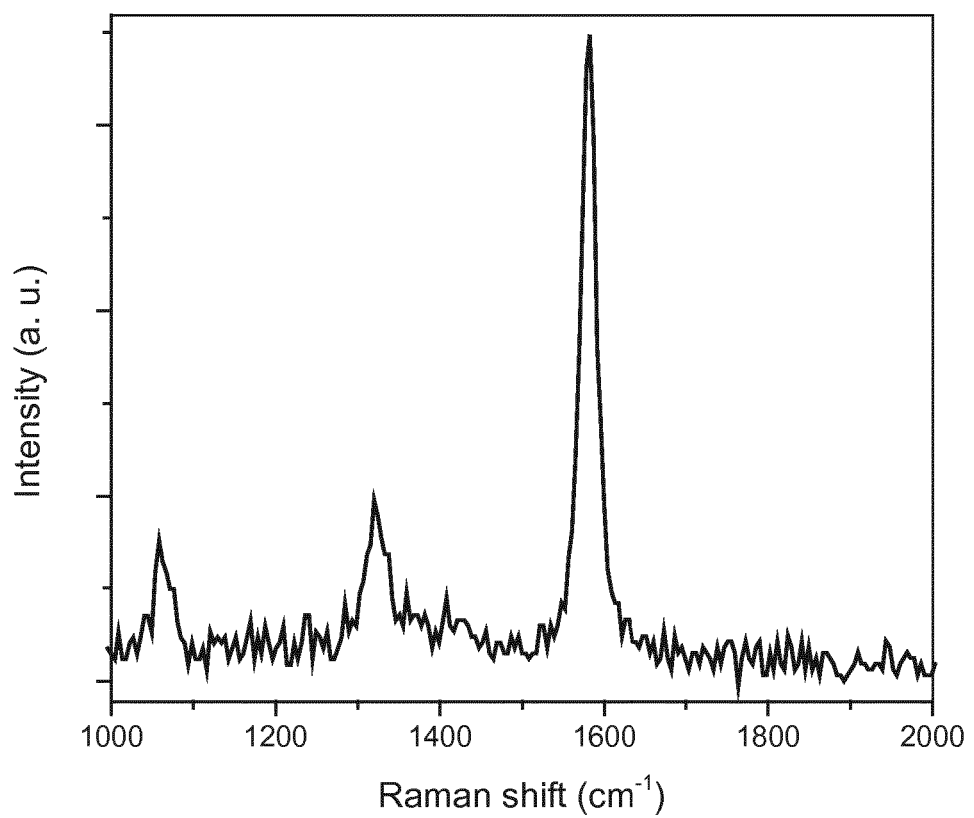

In some regions of the grid, on the mesh and on the grid material, the peaks observed in FIG. 4 and ascribed to C—C $sp^3$ vibration and to lonsdaleite are simultaneously detected with the graphene peak at around 1582 $cm^{-1}$, as shown in FIGS. 5 and 6. This shows that it is possible to elaborate graphene-lonsdaleite stack structures. In the spectrum shown in FIG. 5, the T peak at 1061.6 $cm^{-1}$ (FWHM of 17.3 $cm^{-1}$), the lonsdaleite peak at 1323.5 $cm^{-1}$ (FWHM of 30.9 $cm^{-1}$) and the G peak at 1582.5 $cm^{-1}$ (FWHM of 26 $cm^{-1}$) are detected. In FIG. 5 the height of the T and lonsdaleite peaks is at least twice the height of the G peak. In the spectrum shown in FIG. 6, the T peak at 1062.4 $cm^{-1}$ (FWHM of 26.5 $cm^{-1}$), the lonsdaleite peak at 1323.4 $cm^{-1}$ (FWHM of 34.6 $cm^{-1}$) and the G peak at 1580.8 $cm^{-1}$ (FWHM of 22.2 $cm^{-1}$) are detected. In FIG. 6 the height of the G peak is several time higher than the height of the T and onsdaleite peaks. The inventors hypothesise that the variation of the relative intensity of the peaks related to $sp^2C$ and $sp^3C$ may be indicative of the ratio of $sp^2C$ and $sp^3C$ in the stack sequence.

Figure 7:
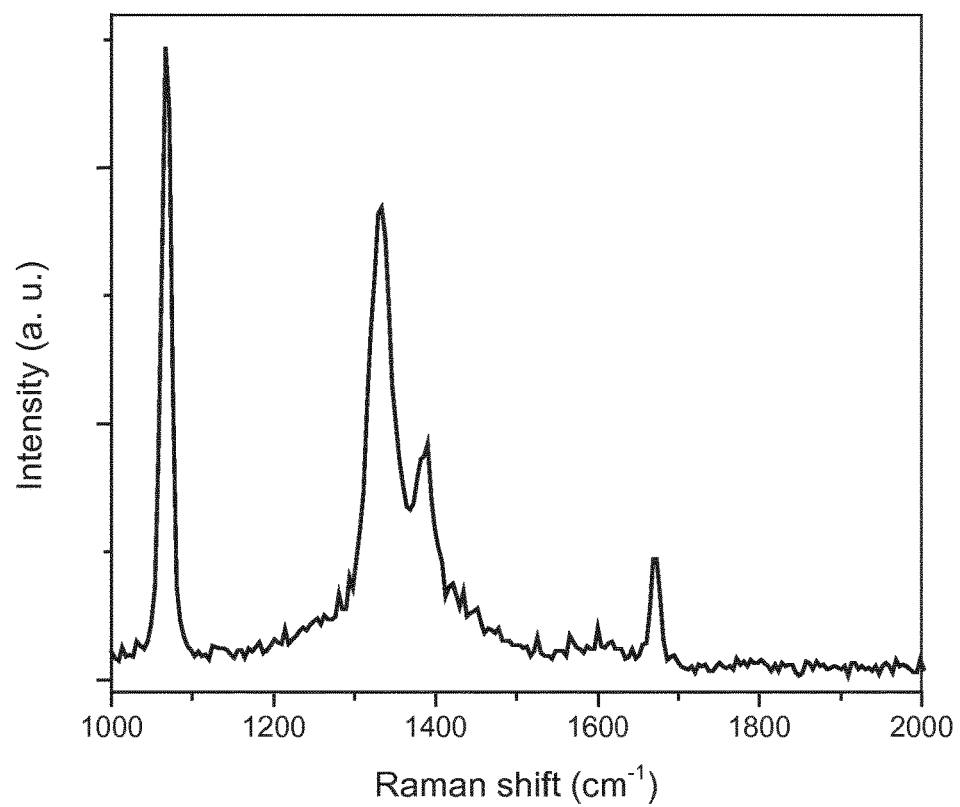

FIG. 7 shows exemplary UV Raman spectrum of diamond sheets elaborated from the hydrogenation of few-layer graphene and subsequent interlayer $sp^3$-C bond formation, at low few-layer graphene temperature, according to the present invention. The spectrum is obtained on the surface of TEM grid material which is around the TEM grid mesh and also in the TEM grid mesh where free-standing few-layer graphene are originally located. The spectrum shown in FIG. 7 is different from the spectrum obtained before the hydrogenation process, which is composed of the G peak at around 1582 $cm^{-1}$ due to C—C $sp^2$ vibration. The spectrum shown in FIG. 7 displays two sharp peaks: the T peak centred at around 1068.0 cm$^{-1}$ and at the diamond peak centred at around 1331.3 cm$^{-1}$, respectively. The full width at half maximum of those two peaks is of around 14.4 cm$^{-1}$ and 32.7 cm$^{-1}$, respectively. The FWHM value of the diamond peak reveals confinement effects in few atomic layers.

Figure 8:
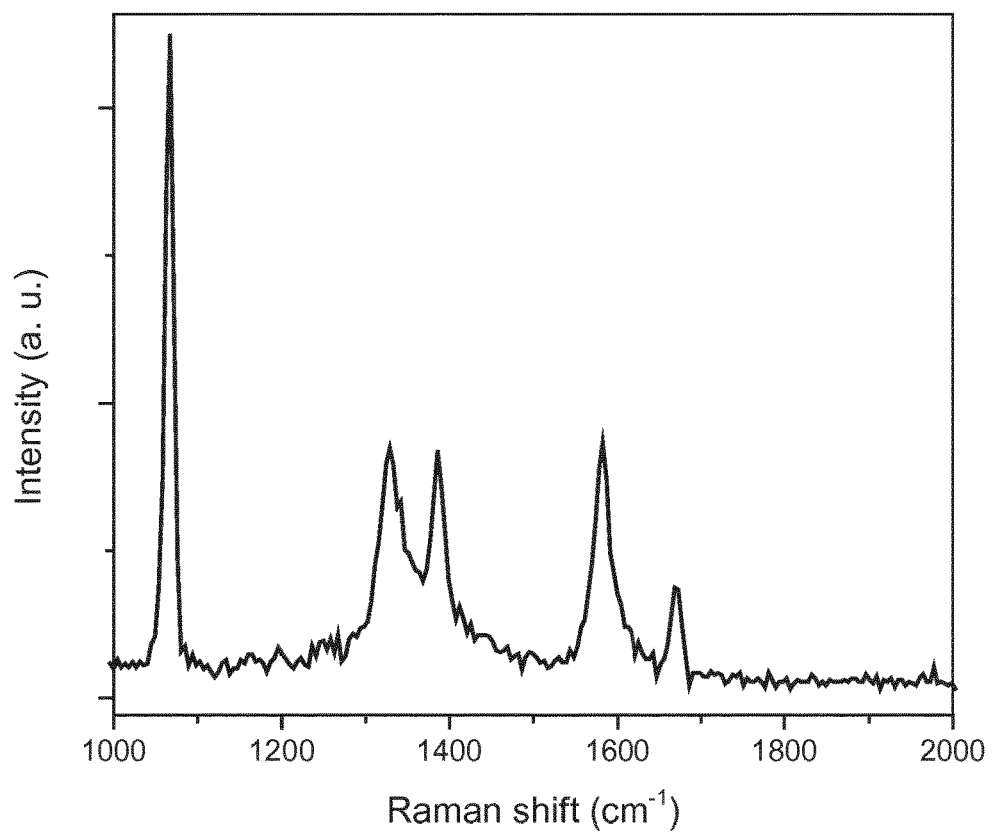

In some regions of the grid, on the mesh and on the material grid, the T and diamond peaks as shown in the FIG. 7 spectrum are simultaneously detected with the graphene peak at around 1582 cm$^{-1}$ (FIG. 8). This shows that it is possible to elaborate graphene-diamond stack structures. In the spectrum shown in FIG. 8, the T peak at 1066.5 cm$^{-1}$ (FWHM of 11.8 cm$^{-1}$), the diamond peak at 1330.1 cm$^{-1}$ (FWHM of 36.3 cm$^{-1}$) and the G peak at 1581.9 cm$^{-1}$ (FWHM of 25.5 cm$^{-1}$) are detected. In FIG. 8 the height of the diamond and G peaks is similar.

CONCLUSIONS

To summarize, a new process has been developed to obtain ultrathin and crystalline sp$^3$-bonded carbon sheets, including ultrathin diamond sheets and including ultrathin lonsdaleite sheets, which are new nanomaterials, from the hydrogenation and subsequent interlayer sp$^3$-C bond formation of few-layer graphene at low graphene and substrate temperature, below 325° C. and down to about 170° C., and at low pressure, below 100 Torr and down to about 5 Torr.

The synthesis of ultrathin and crystalline sp$^3$-bonded carbon sheets, including ultrathin diamond sheets and including ultrathin lonsdaleite sheets, has been successfully demonstrated for the first time, via the exposure of few-layer graphene, to pure H$_2$ activated by HFCVD. The inventors theorise that, depending on relative orientation of the graphene layers and when it is energetically favourable, the chemisorption of elements such as hydrogen on the graphene planes leads to the interlayer sp$^3$-C bond formation required for formation of the ultrathin and crystalline sp$^3$-bonded carbon sheet structure, in line with previous theoretical works in this field.

Large area of the planes of the few-layer graphene, exposed to hydrogen, are hydrogenated and carbon atoms are bonded to one hydrogen atom. The number of the sheets is typically between 2 and 6, but may be up to e.g. 10.

The temperature of the few-layer graphene and substrate during the process is about 325° C. This method is suitable for mass-production of ultrathin and crystalline sp$^3$-bonded carbon sheets, including ultrathin diamond sheets and including ultrathin lonsdaleite sheets. The new process can also be used to obtain heterostructures of graphene and ultrathin and crystalline sp$^3$-bonded carbon sheets.

Potential applications of these ultrathin and crystalline sp$^3$-bonded carbon sheets elaborated from this method include but are not restricted to passive or active components in transistors and integrated circuits, components of thermal management devices, electrical field shields, components of field emission devices, components of quantum computing devices, building materials for micro-electromechanical systems, building materials for nano-electromechanical systems, components of ultrathin protective coatings, components of wear-resistant coatings, components of composite materials, components of tunnel devices, components of optical linear waveguides, components of lithium batteries, components of supercapacitors, components of biodevices, components of sensors, components of biosensors, components of an active laser medium, and components of optoelectronic sensors.

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For the avoidance of any doubt, any theoretical explanations provided herein are provided for the purposes of improving the understanding of a reader. The inventors do not wish to be bound by any of these theoretical explanations.

Any section headings used herein are for organizational purposes only and are not to be construed as limiting the subject matter described.

Throughout this specification, including the claims which follow, unless the context requires otherwise, the word "comprise" and "include", and variations such as "comprises", "comprising", and "including" will be understood to imply the inclusion of a stated integer or step or group of integers or steps but not the exclusion of any other integer or step or group of integers or steps.

It must be noted that, as used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by the use of the antecedent "about," it will be understood that the particular value forms another embodiment. The term "about" in relation to a numerical value is optional and means for example +/−10%.

REFERENCES

A number of publications are cited above in order to more fully describe and disclose the invention and the state of the art to which the invention pertains. Full citations for these references are provided below.

The entirety of each of these references is incorporated herein.

L. A. Chernozatonskii, P. B. Sorokin, A. G. Kvashnin, and D. G. Kvashnin, JETP Letters (2009) vol. 90, #2 pp. 134-138; *Diamond-Like C$_2$H Nanolayer, Diamane: Simulation of the Structure and Properties.*

D. C. Elias, R. R. Nair, T. M. G. Mohiuddin, S. V. Morozov, P. Blake, M. P. Halsall, A. C. Ferrari, D. W. Boukhvalov, M. I. Katsnelson, A. K. Geim, K. S. Novoselov, Science 323, 610-613 (2009); *Control of Graphene's Properties by Reversible Hydrogenation: Evidence of Graphane.*

O. Leenaerts, B. Partoens, and F. M. Peeters, Physical Review B 80, 245422-1-245422-6 (2009); *Hydrogenation of bilayer graphene and the formation of bilayer graphane from first principles.*

Liyan Zhu, Hong Hu, Qian Chen, Shudong Wang, Jinlan Wang and Feng Ding, Nanotechnology 22, 185202 (7pp) (2011); *Formation and electronic properties of hydrogenated few layer graphene.*

Dorj Odkhuu, Dongbin Shin, Rodney S. Ruoff and Noejung Park, Scientific Reports, 3:3276 (2013); *Conversion of multilayer graphene into continuous ultrathin $sp^3$-bonded carbon films on metal surfaces.*

Srivats Rajasekaran, Frank Abild-Pedersen, Hirohito Ogasawara, Anders Nilsson, and Sarp Kaya, Physical Review Letters 111, 085503-1-085503-5 (2013); *Interlayer Carbon Bond Formation Induced by Hydrogen Adsorption in Few-Layer Supported Graphene.*

Zhiquiang Luo, Ting Yu, Ki-jeong Kim, Zhenhua Ni, Yumeng You, Sanhua Lim, Zexiang Shen, Shanzhong Wang, and Jianyi Lin, ACS Nano 3(7), 1781-1788 (2009); *Thickness-Dependent Reversible Hydrogenation of Graphene Layers.*

J. Robertson, Materials Science and Engineering Reports 37, 129-281 (2002); *Diamond-like amorphous carbon.*

F. Piazza, International Journal of Refractory Metals and Hard Materials 24, 39-48 (2006); *Hard-hydrogenated tetrahedral amorphous carbon films by distributed electron cyclotron resonance plasma.*

H. Touhara, K. Kanodo, Y. Fuji, and N. Watanabe, Zeitschrift fur anorganische und allgemeine chemie 544 (1987) 7-20; *On the Structure of Graphite Fluoride.*

Ajay Kumar, Pin Ann Lin, Albert Xue, Boyi Hao, Yoke Khin Yap and R. Mohan Sankaran, Nature Communications 4:2618 (2013); DOI: 10.1038/ncomms3618; *Formation of nanodiamaonds at near-ambient conditions via microplasma dissociation of ethanol vapour.*

M. A. Prelas, G. Popovici, L. K. Bigelow (Eds.), *Handbook of Industrial Diamonds and Diamond Films*, Marcel Dekker, New York, 1998.

James E. Butler and Anirudha V. Sumant, Chemical Vapor Deposition 14 (2008) 145-160/DOI 10.1002/cvde.200700037; *The CVD of Nanodiamond Materials.*

Jerry Zimmer, K. V. Ravi, Diamond and Related Materials 15 (2006) 229-233; *Aspects of scaling CVD diamond reactors.*

Michael Frenklach and Hai Wang, Physical Review B 43(2), 1520-1544 (1991); *Detailed surface and gas-phase chemical kinetics of diamond deposition.*

J. Stiegler, T. Lang, Y. Von Kaenel, J. Michler, and E. Blank, Applied Physics Letters 70(2), 173-175 (1997); *Activation energy for diamond growth from the carbon-hydrogen gas system at low temperatures.*

S. A. Redman, C. Chung, M. N. R. Ashfold, Diamond and Related Materials 8, 1383-1387 (1999); *H atom production on a hot filament chemical vapour deposition reactor.*

James S. Burgess, Bernard R. Matis, Jeremy T. Robinson, Felipe A. Bulat, F. Keith Perkins, Brian H. Houston, Jeffrey W. Baldwin, Carbon 49 (2011) 4420-4426; *Tuning the electronic properties of graphene by hydrogenation in a plasma enhanced chemical vapour deposition reactor.*

Francesco Bonaccorso, Antonio Lombardo, Tawfique Hasan, Zhipei Sun, Luigi Colombo, and Andre C. Ferrari, Materials today, 2012, 15 (12), 564-589; *Production and processing of graphene and 2d crystals.*

A. C. Ferrari and J. Robertson, Physical Review B 64, 075414-1-075414-13 (2001); *Resonant Raman spectroscopy of disordered, amorphous, and diamondlike carbon.*

Andrea C. Ferrari, Francesco Bonaccorso, Vladimir Fal'ko, Konstantin S. Novoselov, Stephan Roche, Peter Bøggild, Stefano Borini, Frank H. L. Koppens, Vincenzo Palermo, Nicola Pugno, José A. Garrido, Roman Sordan, Alberto Bianco, Laura Balleriniq Maurizio Prato, Elefterios Lidorikis, Jani Kivioja, Claudio Marinelli, Tapani Ryhanen, Alberto Morpurgo, Jonathan N. Coleman, Valeria Nicolosi, Luigi Colombo, Albert Fert, Mar Garcia-Hernandez, Adrian Bachtold, Grégory F. Schneider, Francisco Guinea, Cees Dekker, Matteo Barbone, Zhipei Sun, Costas Galiotis, Alexander N. Grigorenko, Gerasimos Konstantatos, Andras Kis, Mikhail Katsnelson, Lieven Vandersypen, Annick Loiseau, Vittorio Morandi, Daniel Neumaier, Emanuele Treossi, Vittorio Pellegrini, Marco Polini, Alessandro Tredicucci, Gareth M. Williams, Byung Hee Hong, Jong-Hyun Ahn, Jong Min Kim, Herbert Zirath, Bart J. van Wees, Herre van der Zant, Luigi Occhipinti, Andrea Di Matteo, Ian A. Kinloch, Thomas Seyller, Etienne Quesnel, Xinliang Feng, Ken Teo, Nalin Rupesinghe, Pertti Hakonen, Simon R. T. Neil, Quentin Tannock, Tomas Löfwanderaq and Jari Kinaret, Nanoscale, 7, 4598-4810 (2015); *Science and technology roadmap for graphene, related two-dimensional crystals, and hybrid systems.*

David C. Smith, Gaston Godard, Spectrochimica Acta Part A: Molecular and Biomolecular Spectroscopy 73, 428-435 (2009); *UV and VIS Raman spectra of natural lonsdaleites: Towards a recognised standard.*

Yury G. Gogotsi, Andreas Kailer and Klaus G. Nickel, Journal of Applied Physics 84(3), 1299-1304 (1998); *Pressure-induced phase transformation in diamond.*

Leonid A. Chernozatonskii, Boris N. Mavrin, and Pavel B. Sorokin, Physica Status Solidi B 249(8), 1550-1554 (2012)/DOI 10.1002/pssb.201147478 *Determination of ultrathin diamond films by Raman spectroscopy.*

William Regan, Nasim Alem, Benjamin Aleman, Baisong Geng, Caglar Girit, Lorenzo Maserati, Feng Wang, Michael Crommie, and A. Zettl, *A direct transfer of layer-area graphene*, Applied Physics Letters 96, 113102-1-113102-3 (2010).

The invention claimed is:

1. An ultrathin and crystalline $sp^3$-bonded carbon sheet, wherein the sheet has a maximum thickness of 22 Å.

2. The ultrathin and crystalline $sp^3$-bonded carbon sheet according to claim 1 comprising 2 to 10 atomic layers of $sp^3$-bonded carbon.

3. The ultrathin and crystalline $sp^3$-bonded carbon sheet according to claim 1 wherein at least a portion of the sheet has a structure selected from: lonsdaleite, diamond, or another diamond polytype, or a combination of two or more of these structures.

4. The ultrathin and crystalline $sp^3$-bonded carbon sheet according to claim 1 wherein the sheet is electronically doped.

5. A structure comprising:
at least one ultrathin and crystalline $sp^3$-bonded carbon sheet, wherein the sheet has a maximum thickness of 22 Å,
wherein the structure is selected from the group consisting of:
a stack structure;
a heterostructure further comprising graphene; and
a composite material further comprising a matrix material.

6. The structure according to claim 5 wherein the structure is a stack structure further comprising a material selected from: a one-dimensional material, a two-dimensional material, nanotubes, or nanowires.

7. The structure according to claim 5, wherein the structure is a composite material, and wherein the matrix material comprises a polymer, a semiconductor, a ceramic, a metal, or combinations thereof.

* * * * *